(12) United States Patent
Nakazumi et al.

(10) Patent No.: US 10,749,035 B2
(45) Date of Patent: Aug. 18, 2020

(54) SEMICONDUCTOR DEVICE, PH SENSOR, BIOSENSOR, AND MANUFACTURING METHOD FOR SEMICONDUCTOR DEVICE

(71) Applicant: NIKON CORPORATION, Tokyo (JP)

(72) Inventors: Makoto Nakazumi, Yamato (JP); Yasutaka Nishi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 19 days.

(21) Appl. No.: 16/251,608

(22) Filed: Jan. 18, 2019

(65) Prior Publication Data

US 2019/0181268 A1 Jun. 13, 2019

Related U.S. Application Data

(63) Continuation of application No. PCT/JP2017/026223, filed on Jul. 20, 2017.

(30) Foreign Application Priority Data

Aug. 3, 2016 (JP) .................. 2016-152721

(51) Int. Cl.
| | |
|---|---|
| *H01L 29/786* | (2006.01) |
| *H01L 21/02* | (2006.01) |
| *G01N 27/414* | (2006.01) |
| *H01L 27/12* | (2006.01) |
| *H01L 27/32* | (2006.01) |
| *H01L 29/417* | (2006.01) |

(52) U.S. Cl.
CPC ..... *H01L 29/7869* (2013.01); *G01N 27/4145* (2013.01); *H01L 21/02381* (2013.01); *H01L 21/02488* (2013.01); *H01L 21/02554* (2013.01); *H01L 21/02565* (2013.01); *H01L 21/02576* (2013.01); *H01L 27/1225* (2013.01); *H01L 27/3262* (2013.01); *H01L 29/41733* (2013.01); *H01L 29/786* (2013.01); *H01L 29/78618* (2013.01); *H01L 21/02631* (2013.01)

(58) Field of Classification Search
CPC ......... H01L 21/02554; H01L 21/02565; H01L 21/02576; H01L 27/1225; H01L 27/3262; H01L 29/41733; H01L 29/786; H01L 29/78618; H01L 21/02631
See application file for complete search history.

(56) References Cited

U.S. PATENT DOCUMENTS

| | | |
|---|---|---|
| 2010/0159639 A1 | 6/2010 | Sakata |
| 2012/0306834 A1 | 12/2012 | Ueda et al. |

(Continued)

FOREIGN PATENT DOCUMENTS

| | | |
|---|---|---|
| JP | 2010-166030 | 7/2010 |
| JP | 2010-205923 | 9/2010 |

(Continued)

OTHER PUBLICATIONS

International Search Report dated Sep. 5, 2017 in corresponding International Application No. PCT/JP2017/026223.

*Primary Examiner* — Seahvosh Nikmanesh

(57) ABSTRACT

There is provided a semiconductor device including: a first electrode; a second electrode; and a semiconductor layer in contact with the first electrode and the second electrode, in which the semiconductor layer is a spinel-type oxide containing zinc (Zn) and gallium (Ga).

9 Claims, 6 Drawing Sheets

(56) References Cited

U.S. PATENT DOCUMENTS

| | | | | |
|---|---|---|---|---|
| 2015/0037620 A1* | 2/2015 | Nishi | ................ | H01M 10/0525 |
| | | | | 429/7 |
| 2015/0276663 A1 | 10/2015 | Takechi et al. | | |
| 2015/0287745 A1* | 10/2015 | Kato | ................... | H01L 27/1225 |
| | | | | 257/43 |
| 2015/0364610 A1 | 12/2015 | Tsubuku et al. | | |

FOREIGN PATENT DOCUMENTS

| JP | 2011-192971 | 9/2011 |
|---|---|---|
| JP | 2015-190848 | 11/2015 |
| JP | 2016-15484 | 1/2016 |
| JP | 2016-152721 | 8/2016 |

\* cited by examiner

FIG. 6

Table 1

|  |  | pH 1 | pH2 | pH3 | pH4 | pH 5 | pH6 |
|---|---|---|---|---|---|---|---|
| EXAMPLE 1 | SPINEL $ZnGa_2O_4$ | ○ | ○ | ○ | ○ | ○ | ○ |
| COMPARATIVE EXAMPLE 1 | $InGaZnO_4$ (IGZO) | × | × | △ | ○ | ○ | ○ |
| COMPARATIVE EXAMPLE 2 | InGaZnSnO (IGZTO) | × | △ | ○ | ○ | ○ | ○ |
| COMPARATIVE EXAMPLE 3 | ITO | × | × | × | △ | ○ | ○ |
| COMPARATIVE EXAMPLE 4 | ZnO | × | × | × | △ | ○ | ○ |
| COMPARATIVE EXAMPLE 5 | Amorphous $ZnGa_2O_4$ | × | × | △ | ○ | ○ | ○ |

SEMICONDUCTOR DEVICE, PH SENSOR, BIOSENSOR, AND MANUFACTURING METHOD FOR SEMICONDUCTOR DEVICE

CROSS-REFERENCE TO RELATED APPLICATIONS

This application is a continuation of international application No. PCT/JP2017/26223 filed Jul. 20, 2017, which claims the foreign priority benefit to Japanese Patent Application No. 2016-152721, filed Aug. 3, 2016, the disclosures of which are herein incorporated by reference in their entirety.

BACKGROUND

Technical Field

The present invention relates to a semiconductor device, a pH sensor, a biosensor, and a manufacturing method for a semiconductor device. The present invention claims the priority of Japanese Patent Application No. 2016-152721 filed Aug. 3, 2016, and for designated countries where incorporation by reference of the literature is permitted, the content described in the application is incorporated herein by reference.

Related Art

As a semiconductor material used for a semiconductor device such as a thin film transistor (TFT), for example, an amorphous oxide like an oxide composed of In, Ga, and Zn (IGZO; In—Ga—Zn—O) is used (Refer to JP 2013-051421 A). Since chemical durability of such a conventional semiconductor material is not sufficient, a structure to protect the semiconductor material from chemical damage is provided and processing such as an etching process is performed at the time of manufacturing a semiconductor device.

SUMMARY

A first aspect of the present invention is a semiconductor device including a first electrode, a second electrode, and a semiconductor layer in contact with the first electrode and the second electrode, in which the semiconductor layer is a spinel-type oxide containing zinc (Zn) and gallium (Ga).

A second aspect of the present invention is a pH sensor including the semiconductor device of the first aspect.

A third aspect of the present invention is a biosensor including the semiconductor device of the first aspect.

A fourth aspect of the present invention is a manufacturing method for a semiconductor device including: forming a semiconductor layer; forming a conductive layer on the semiconductor layer; and forming a first electrode and a second electrode by etching the conductive layer in a manner conforming to a predetermined pattern.

BRIEF DESCRIPTION OF THE DRAWINGS

FIG. 6 is a table (Table 1) showing pH evaluation results of oxide semiconductor surface stability between Example 1 and Comparative Examples 1-5.

DETAILED DESCRIPTION

Figure 1:
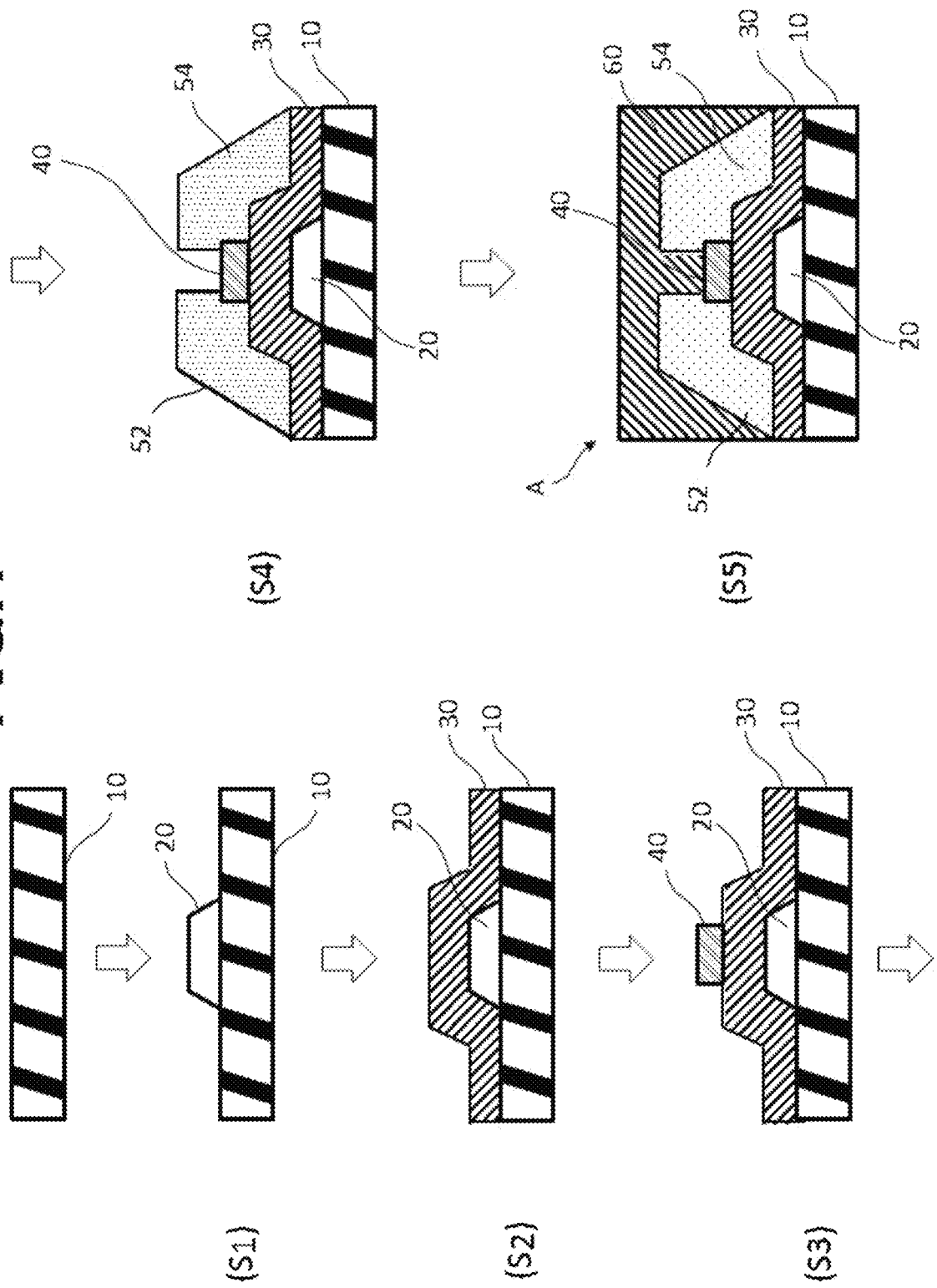
FIG. 1 is a conceptual diagram to describe a preferred example of a manufacturing method according to the present embodiment.

A detailed description will hereinafter be given for an embodiment to implement the present invention (hereinafter simply referred to as "the present embodiment"). The present embodiment described below is an example to describe the present invention and is not intended to limit the present invention to the following contents. In the drawings, note that positional relations such as up, down, right, and left are on the basis of positional relations illustrated in the drawings unless otherwise particularly specified. Additionally, note that dimensional ratios in the drawings are not limited to illustrated ratios.

A semiconductor device according to the present embodiment is a semiconductor device including a first electrode, a second electrode, and a semiconductor layer in contact with the first electrode and the second electrode, in which the semiconductor layer is a spinel-type oxide containing zinc (Zn) and gallium (Ga). The semiconductor device according to present embodiment uses an oxide having a spinel-type crystal structure, thereby achieving an advantage of not requiring an additional manufacturing process and an additional structure to prevent chemical damage caused by acids. Therefore, the structure of the semiconductor device according to present embodiment can be a structure not including a protective layer to protect a semiconductor layer.

In the related art, $ZnO$, $In_2O_3$, $Ga_2O_3$, $InGaZnO$, and the like are used as materials of an oxide semiconductor, and these materials exhibit high semiconductor characteristics but has insufficient resistance to acids and bases. For example, the oxide semiconductor is eroded under conditions of a strong acid such as pH 4 or less or a strong base such as pH 10 or more. There is the above-described problem of having weak resistance to the acids in both of an amorphous oxide and a crystalline oxide, and having stability in a wide pH range is desired. In this point, the semiconductor device according to present embodiment has high stability against strong acids and strong bases and further has high stability in the wide pH range.

The semiconductor layer preferably contains a spinel-type $ZnGa_2O_4$. This can further improve resistance to acidity and basicity. For example, in a case where spinel-type $ZnGa_2O_4$ is a semiconductor layer, a processing method such as fluorine dry etching or wet etching can be adopted.

It is preferable that the semiconductor layer be doped with a carrier element from the viewpoint of further improving the semiconductor characteristics of the semiconductor layer. The carrier element is not particularly limited, and a known carrier element can be adopted in a doping process. Specific examples thereof can include a monovalent metal, a divalent metal, a trivalent metal, and the like. Among these, it is more preferable that the semiconductor layer be doped with hydrogen in the present embodiment.

The semiconductor device according to the present embodiment further includes: an insulating layer in contact with the semiconductor layer; and a third electrode provided in a manner facing the semiconductor layer via the insulating layer, in which a transistor is preferably formed by using the first electrode, the second electrode, and the third electrode as a source electrode, a drain electrode, and a gate electrode, respectively.

When the first electrode is used as a source electrode, the source electrode is not particularly limited, and a known one can be adopted. Specific examples thereof can include a single layer of Mo, W, Al, Cu, a Cu—Al alloy, an Al—Si alloy, a Mo—W alloy, a Ni—P alloy, or the like, and a laminated body thereof.

When the second electrode is used as a drain electrode, the drain electrode is not particularly limited, and a known one can be adopted. Specific examples thereof can include a single layer of Mo, W, Al, Cu, a Cu—Al alloy, an Al—Si alloy, a Mo—W alloy, a Ni—P alloy, or the like, and a laminated body thereof.

When the third electrode is used as a gate electrode, the gate electrode is not particularly limited, and a known one can be adopted. Specific examples thereof can include a single layer of Mo, W, Al, Cu, a Cu—Al alloy, an Al—Si alloy, a Mo—W alloy, a Ni—P alloy, or the like, and a laminated body thereof.

The semiconductor device according to the present embodiment can be suitably used in a pH sensor, a biosensor, and the like. As described above, since the semiconductor device according to the present embodiment has high stability against strong acids and strong bases and has high stability in the wide pH range like pH 1 to pH 14, it is possible to achieve a pH sensor capable of correctly measuring even a strong acid/strong base.

A biosensor (may also be referred to as a biosensor chip) is a chemical sensor that utilizes a bio-originated molecule recognition mechanism and is used as a chemical recognition element for a pH change, oxidation reduction reaction, and the like inside a living body. In this point, since the semiconductor device according to present embodiment has high stability in the wide pH range, it is possible to achieve a biosensor capable of performing correct sensing even when a measurement object has strong acidity/strong basicity. For example, it is possible to achieve a biosensor that modifies a certain antibody on a semiconductor surface and measures a proton amount when a detection target such as DNA specific thereto is absorbed.

In a conventional structure, measurement is performed while providing a protective layer to protect a semiconductor layer, but in this case, a thickness of the protective layer is usually required to be about 100 nm or more, whereas a general size of an antibody is about several nanometers, and therefore, when the protective layer is provided, electrical information in which the size of the antibody is reflected cannot be obtained. However, in the semiconductor device according to the present embodiment, since a protective layer to protect a semiconductor layer is not necessarily provided and the protective layer can be omitted, detection with high speed and high sensitivity can be achieved.

The semiconductor device according to present embodiment is excellent in not only having semiconductor characteristics such as electron conductivity but also having resistance to acidity and basicity that cannot be attained conventionally, and therefore, a strong acid component and a photoacid generator can be quickly and correctly detected. Additionally, in a case where a semiconductor device is formed into a device, miniaturization and fineness of a wiring pattern is expected because of having high etching resistance, and contribution can be made to weight reduction and the like as a device. Furthermore, it is expected to broaden options of a material of a metal electrode. Therefore, the semiconductor device according to the present embodiment can be used in a wide range of applications such as not only the above-described sensor but also displays and various kinds of electronic devices.

<Manufacturing Method>

A preferred example of a manufacturing method for a semiconductor device according to the present embodiment will be described. The manufacturing method according to the present embodiment can be a method including steps of: forming a semiconductor layer; forming a conductive layer on the semiconductor layer; and forming a first electrode and a second electrode by etching the conductive layer in a manner conforming to a predetermined pattern. In the semiconductor device according to the present embodiment is also applicable to, for example, manufacture of an inverse staggered TFT because the semiconductor layer has strong resistance to acids and can withstand an acid etching solution. FIG. 1 illustrates a conceptual diagram to describe an exemplary manufacturing method according to the present embodiment.

(Step S1)

First, a gate electrode 20 is formed on a surface of a substrate 10 (step S1). The substrate is not particularly limited, and a known material can be adopted. Specific examples thereof include glass, silicon, a metal, an alloy, and a foil thereof. The gate electrode 20 corresponds to the third electrode described above. A method for forming the gate electrode 20 on the surface of the substrate 10 is not particularly limited, and a suitable method can be adopted as appropriate considering materials and the like of the substrate 10 and gate electrode 20.

(Step S2)

Next, an insulating layer 30 is formed on the surface of the substrate 10 on the side where the gate electrode 20 is formed, and the gate electrode 20 is covered with an insulating layer 30 (step S2). The insulating layer 30 is not particularly limited, and a known material can be adopted. Specific examples thereof include $SiO_2$, $Si_3N_4$, SiON, $Al_2O_3$, $Ta_2O_5$, $HfO_2$, and the like.

(Step S3)

Then, a semiconductor layer 40 that is a conductive layer is formed on a surface of the insulating layer 30 (step S3). The semiconductor layer 40 can be formed by using a sputtering device, and it is preferable to form a predetermined semiconductor layer 40 by using a plurality of cathodes. The semiconductor layer 40 to be formed is a spinel-type oxide containing zinc (Zn) and gallium (Ga). By using such an oxide, the semiconductor layer 40 exhibits strong resistance to strong acids and strong bases. Therefore, as a manufacturing process, a step of protecting the semiconductor layer or the like can be omitted. Specifically, the semiconductor layer 40 formed of the spinel-type gallium zinc oxide can be formed by performing co-sputtering while using a gallium zinc oxide and a zinc oxide as targets.

Alternatively, it may be possible to use a method in which co-sputtering is performed while using a gallium oxide and a zinc oxide as targets, or a method in which co-sputtering is performed while using gallium and zinc as targets and then oxidization is performed with a reactive gas during deposition. Furthermore, not limited to the co-sputtering, it may be possible to use a method in which sputtering is performed while using a mixture of a zinc oxide and a gallium oxide as a target, or a method in which sputtering is performed while using a mixture of zinc and gallium as a target and then oxidization is performed with a reactive gas during deposition.

For example, an n-type semiconductor material can be manufactured by element doping and causing oxygen defect inside a film. An element from which the n-type semiconductor can be obtained is not particularly limited, but examples thereof include Al, In, Sn, Sb, Ta, and the like. A method of causing oxygen defect is not particularly limited, and a known method can be adopted. Specifically, it is preferable that heat treatment be applied in an oxygen-vulnerable atmosphere or a reducing gas atmosphere, such as hydrogen. For example, there is a method in which deposition is performed in a state where hydrogen is mixed in a sputtering gas and n-type carrier doping is performed with interstitial hydrogen. The above treatment may be performed inside a chamber after deposition or calcination may be performed as a post-process.

A deposition temperature of the semiconductor layer 40 is not particularly limited, but from the viewpoint of improving crystallinity of the semiconductor layer 40, deposition is preferably performed at 190° C. or higher. Incidentally, in a case of excessive heating, evaporation of Zn particles flying to the surface of the substrate 10 may be promoted and a deviation (composition deviation) from a stoichiometric ratio of Ga and Zn may be caused, however; a Zn concentration in the film can be increased by simultaneously discharging a sintered body target containing Zn or ZnO, and such a composition deviation can be effectively prevented.

(Step S4)

The step of forming a conductive layer on the semiconductor layer 40 and the step of forming a first electrode 52 and a second electrode 54 by etching the conductive layer in a manner conforming to a predetermined pattern are performed (S4). The first electrode 52 is a source electrode and the second electrode 54 is a drain electrode. As a method of forming the first and second electrodes, an ordinary photolithography process can be used. In this case, a resist layer is formed on the conductive layer after forming the conductive layer on the semiconductor layer 40, and the resist layer is exposed and developed with predetermined pattern light. Next, the first electrode and the second electrode can be formed by etching the conductive layer exposed from an opened portion of the resist layer. Note that a positive-type material or a negative-type material may be used as the resist layer.

In the prior art, oxides such as IGZO, ZnO and $Ga_2O_3$ are used as semiconductor materials, but these are amphoteric substances and dissolved in a strong acid solution or a strong basic solution. In other words, since the conventional semiconductor layer has low resistance to a solution used in etching, a step of protecting the semiconductor layer with an insulating layer of $SiO_2$, $Al_2O_3$, or the like serving as a protective layer is required before an etching step to form the source/drain electrodes. In this point, according to present embodiment, since the semiconductor layer 40 has high resistance to acidity and basicity, etching can be performed without providing such a protective layer. Therefore, there is no need to provide the step of providing a protective layer to protect the semiconductor layer, and the manufacturing steps for a semiconductor device can be simplified.

In the case where etching is performed with an acidic solution, the above-described advantages of the present embodiment become more evident. Since a resist material used in the ordinary photolithography process is soluble in alkaline, a conductive layer can be suitably etched by using an acid solution without dissolving the resist layer.

(Step S5)

Then, a passivation layer 60 is formed on the first electrode 52 and the second electrode 54 formed in the step S4, and the semiconductor device A can be obtained. Passivation can be achieved by forming the passivation layer 60 on an outermost surface of the substrate 10. With this structure, the inside of the semiconductor device A can be protected from external moisture, metal ions, and the like. A material of the passivation layer 60 is not particularly limited, and a known material can be adopted. Additionally, a method of forming the passivation layer 60 is not particularly limited, and a known method can be adopted. Note that, in the present embodiment, the passivation layer 60 is not an indispensable component and the passivation layer 60 may not be necessarily included depending on a use of the semiconductor device although the manufacturing method for the semiconductor device including the passivation layer 60 has been described above.

EXAMPLE

The present invention will be described more in detail using the following example and comparative examples, but the present invention is not limited by the following example.

Example 1

A sintered body target of $ZnGa_2O_4$ and a sintered body target of ZnO were prepared. The sintered body targets were simultaneously electrically discharged such that a molar ratio of Ga and Zn in a thin film became Ga:Zn=2:1, and a $ZnGa_2O_4$ thin film was obtained. Note that Ar containing 3% of hydrogen was used as a sputtering gas, and deposition was performed under the conditions of a back pressure of $1\times10^{-4}$ Pa or less, a deposition pressure of 0.22 Pa, and a substrate temperature of 190° C.

Figure 2:
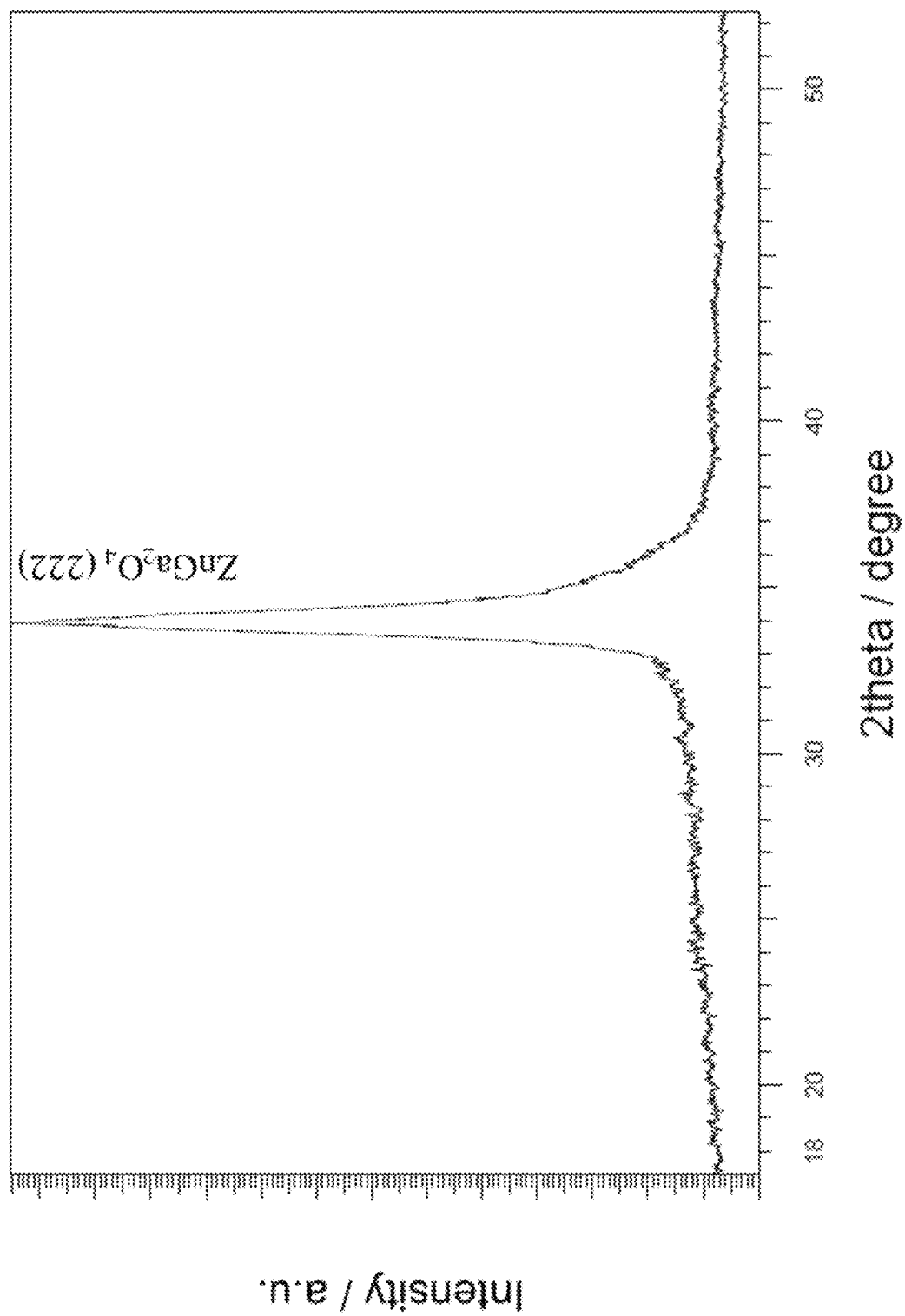
FIG. 2 is a diffraction pattern of a sintered body $ZnGa_2O_4$ obtained from measurement by the XRD in Example 1.

The obtained $ZnGa_2O_4$ thin film was subjected to θ-2θ measurement by an X-ray diffractometry (XRD). FIG. 2 illustrates a diffraction pattern of the $ZnGa_2O_4$ thin film obtained by the XRD measurement. As a result, the pattern of the spinel-type $ZnGa_2O_4$ oriented in a (222) plane could be confirmed, and it was found that the obtained $ZnGa_2O_4$ thin film was a spinel-type $ZnGa_2O_4$ thin film.

Then, a thin film transistor was manufactured while using the above spinel-type $ZnGa_2O_4$ thin film as a semiconductor layer. As a substrate, an n-type doped (phosphorous-doped) silicon wafer on which a 150 nm thermal oxide film was formed was used, and $ZnGa_2O_4$ was deposited on the thermal oxide film under the above deposition conditions.

Figure 3:
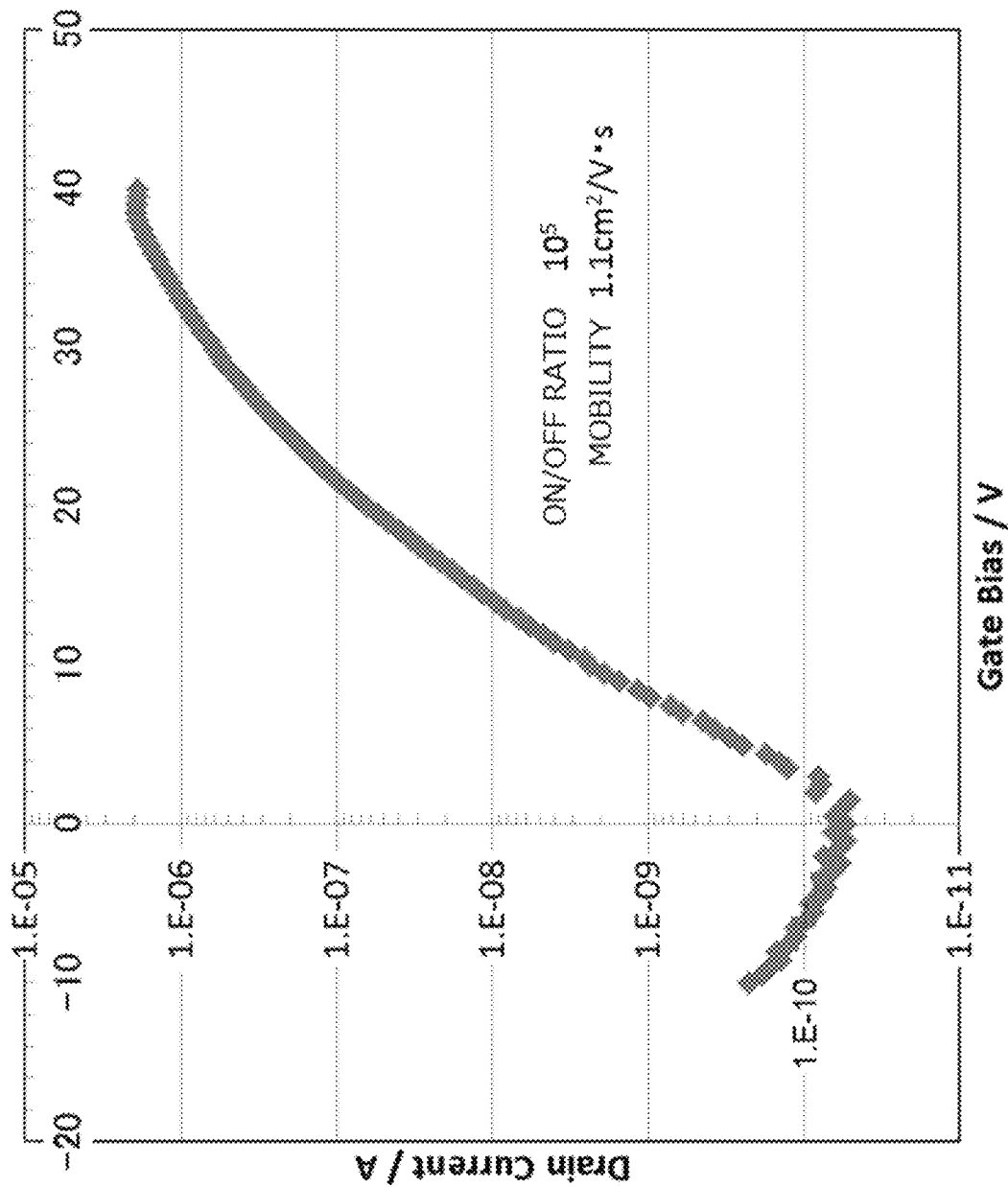
FIG. 3 is a graph illustrating a measurement result of semiconductor characteristics in Example 1.

Then, a Cu electrode to be source/drain electrodes was deposited by a sputtering method, and a semiconductor device was obtained by using the silicon wafer of the substrate as a gate electrode and using the thermal oxide film as a gate insulating film. Regarding semiconductor characteristics of the obtained semiconductor device, transistor characteristics were measured by using a semiconductor parameter analyzer (4200-SCS, manufactured by KEITHLEY). FIG. 3 illustrates a result thereof. In FIG. 3, a horizontal axis represents voltage applied to the gate electrode, and a vertical axis represents a current value detected by the drain electrode. As illustrated in FIG. 3, it was confirmed that the semiconductor device of the present example exhibited n-type semiconductor characteristics. Additionally, the semiconductor device of the present example exhibited characteristics of mobility: 1.1 $cm^2/Vs$, carrier density: $1\times10^{17}$ $cm^{-3}$, and an on/off ratio: $1\times10^5$.

(pH Sensor)

(Experiment a)

Figure 4:
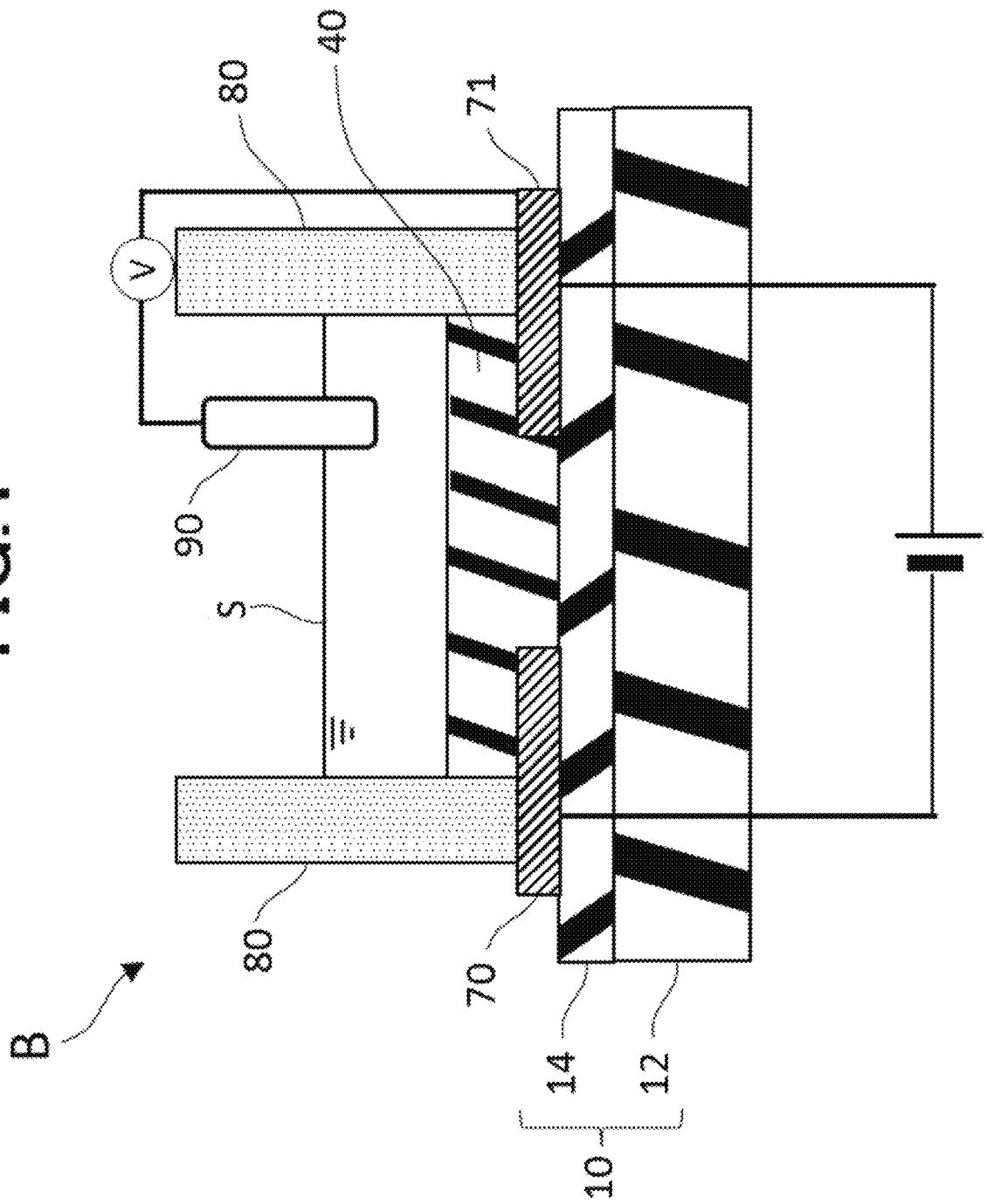
FIG. 4 is a schematic cross-sectional view of a pH sensor of Example 1.

A pH sensor (ion sensitive field effect transistor (FET)) was manufactured by using the semiconductor device obtained above. FIG. 4 illustrates a schematic structure diagram of the pH sensor. A pH sensor B included: a semiconductor substrate 10 having a thermal oxide film 14 formed on a base layer 12; a semiconductor device including a semiconductor layer ($ZnGa_2O_4$:$H_2$) 40 provided on the substrate 10 and Ag electrodes 70 and 71; a silicon rubber pool 80 provided on the semiconductor device; and a reference electrode 90 provided inside the pool 80. Note that an Ag/AgCl electrode (silver-silver chloride electrode) was used as the reference electrode 90. Then, a solution S to be measured (hydrochloric acid in a case of an acidic solution, and a sodium hydroxide solution in a case of an alkaline solution) was put into the pool 80, and a potential difference between the reference electrode 90 and the Ag electrode 71 was measured. Note that solutions of pH 1, pH 7, pH 14 were prepared as the solution S and measurement was started one second after each solution was put into the pool 80. The potential difference between the reference electrode 90 and the Ag electrode 71 depends on a proton concentration in the solution. A measurement principle of the pH sensor is to acquire the proton concentration in each solution by measuring the potential difference and calculate the proton concentration as a pH value.

Figure 5:
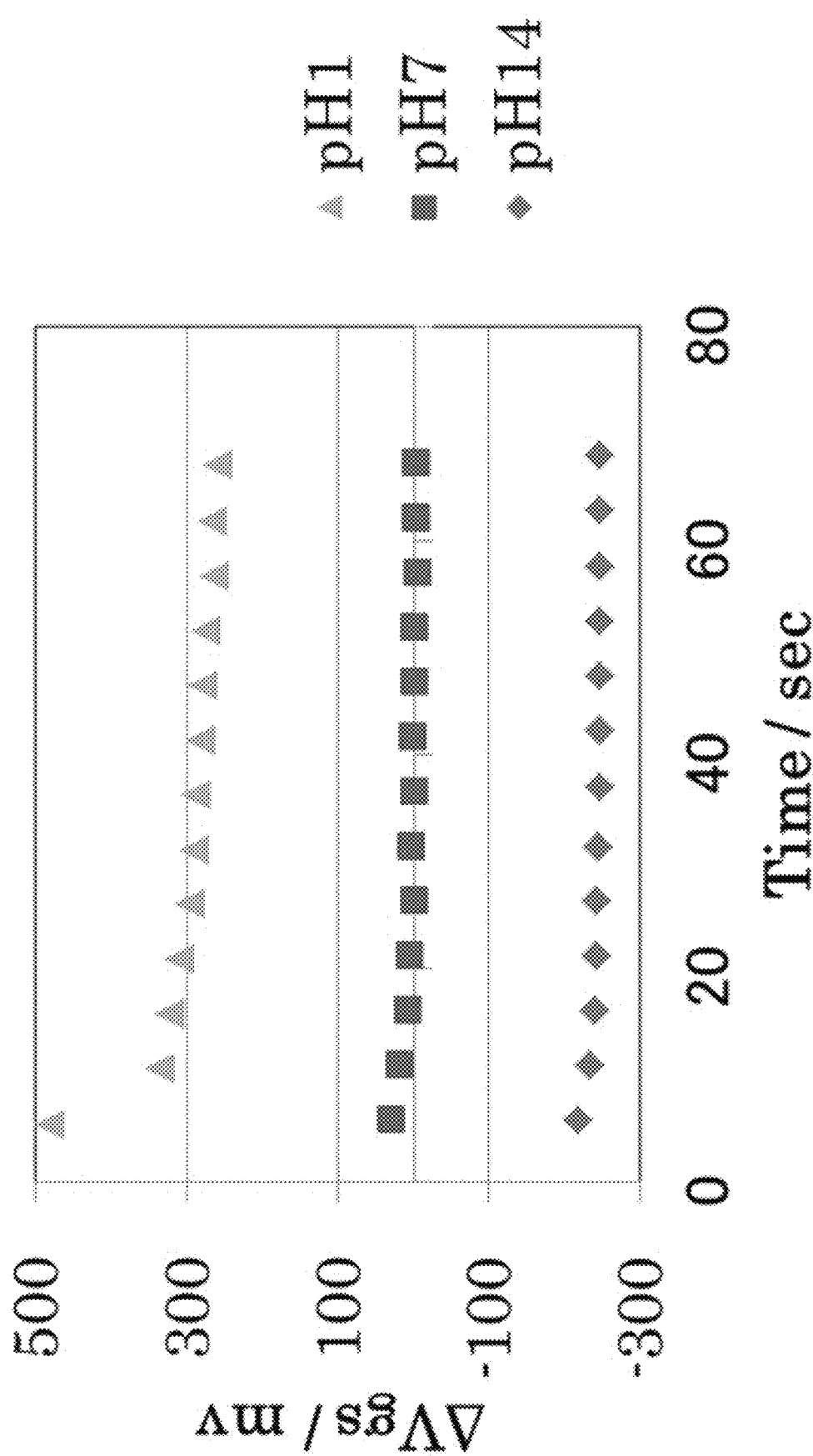
FIG. 5 is a graph illustrating a measurement result of the pH sensor of Example 1.

FIG. 5 is a graph illustrating measurement results of the pH sensor of Example 1. A horizontal axis represents time and a vertical axis represents a potential difference between the reference electrode 90 and the Ag electrode 71. As illustrated in FIG. 5, it was confirmed a measured value (pH value) was not largely changed with time in both of the solutions of pH 1 and pH 14 and measurement could be stably performed over a long period of time. Additionally, measurement was started one second after each solution S was put into the pool 80, but a potential difference was detected even after the one second, and it was confirmed that high-speed response could be obtained.

(Experiment b)

After measuring the solution S of pH 1 in Experiment a, the semiconductor layer 40 and the Ag electrodes 70, 71 were cleaned with water and a similar measurement experiment was carried out again using the solution S of pH 1. As a result, similar values were obtained, and it was confirmed that there was reproducibility. After measuring the solution S of pH 14, the semiconductor layer 40 and the Ag electrodes 70 and 71 were cleaned with water, and a similar measurement experiment was performed again using the solution S of pH 14. As a result, similar values were obtained, and it was confirmed that there was reproducibility. From the results of Experiment b, it was confirmed that there was reproducibility in a measured value of the pH sensor of the present example, and even under the conditions of the strong acidity/strongly basicity such as pH 1 and pH 14, it was confirmed that the semiconductor layer 40 of the pH sensor could be stably and repeatedly used without being eroded.

According to the above results, it was confirmed that the present pH sensor could perform high-speed stable pH measurement despite the fact of not including insulating film to protect the semiconductor layer.

Comparative Examples 1 to 5

A spinel-type oxide containing zinc (Zn) and gallium (Ga) (Example 1) and oxides other than the spinel-type oxide listed in Table 1 of FIG. 6 were prepared respectively (Comparative Examples 1 to 5), and evaluation was made on stability in solutions of pH 1 to pH 6. Specifically, experiments were carried out as follows.

Hydrochloric acids of pH 1, pH 2, pH 3, pH 4, pH 5, and pH 6 were prepared, 1 mL each thereof was dropped onto a surface of each oxide semiconductor, and the surface was left for 10 minutes under the conditions of a room temperature and 1 atm. Then, stability of the surface was visually evaluated on the basis of the following criteria.

○: No change in Surface
Δ: Surface partly eroded by solution
X: Surface eroded by solution As apparent from Table 1 of FIG. 6, it was confirmed that the surface was not eroded in an entire range from pH 1 to pH 6 in Example 1, and there is high resistance to the strong acids.

REFERENCE SIGNS LIST 10 substrate
12 base layer
14 thermal oxide film
20 gate electrode
30 insulating layer
40 semiconductor layer
52 first electrode
54 second electrode
60 passivation layer
70, 71 Ag electrode
80 pool
90 reference electrode
A semiconductor device
B pH sensor
S solution

What is claimed is:

1. A manufacturing method for a semiconductor device, comprising:
    forming a semiconductor layer;
    forming a conductive layer on the semiconductor layer; and
    forming a first electrode and a second electrode by etching the conductive layer in a manner conforming to a predetermined pattern,
    wherein the semiconductor layer is a spinel-type oxide containing zinc (Zn) and gallium (Ga).

2. The manufacturing method for a semiconductor device according to claim 1, wherein the semiconductor layer is a spinel-type $ZnGa_2O_4$.

3. The manufacturing method for a semiconductor device according to claim 1, wherein the semiconductor layer is doped with a carrier element.

4. The manufacturing method for a semiconductor device according to claim 1, wherein the semiconductor layer is doped with hydrogen.

5. The manufacturing method for a semiconductor device according to claim 1, wherein the first electrode and the second electrode are a source electrode and a drain electrode of a transistor, respectively.

6. A manufacturing method for a pH sensor, comprising a manufacturing method for a semiconductor device according to claim 1.

7. A manufacturing method for a biosensor, comprising a manufacturing method for a semiconductor device according to claim 1.

8. A manufacturing method for a semiconductor device according to claim 1, wherein etching is performed with an acidic solution.

9. The manufacturing method for a semiconductor device according to claim 1, wherein forming the semiconductor layer is performed at 190° C. or more.

* * * * *